United States Patent [19]

Otoshi et al.

[11] Patent Number: 5,443,645

[45] Date of Patent: Aug. 22, 1995

[54] MICROWAVE PLASMA CVD APPARATUS COMPRISING COAXIALLY ALIGNED MULTIPLE GAS PIPE GAS FEED STRUCTURE

[75] Inventors: Hirokazu Otoshi; Tetsuya Takei; Yasuyoshi Takai, all of Nagahama; Ryuji Okamura, Shiga; Shigeru Shirai, Hikone; Teruo Misumi, Nagahama, all of Japan

[73] Assignee: Canon Kabushiki Kaisha, Tokyo, Japan

[21] Appl. No.: 173,948

[22] Filed: Dec. 28, 1993

Related U.S. Application Data

[63] Continuation of Ser. No. 820,644, Jan. 21, 1992, abandoned.

[30] Foreign Application Priority Data

May 19, 1990 [JP] Japan ................................. 2-128155

[51] Int. Cl.6 ............................................. C23C 16/50
[52] U.S. Cl. ............................ 118/718; 118/723 MW; 118/723 ME; 118/730; 118/715
[58] Field of Search ............... 118/723 MW, 723 ME, 118/723 MR, 723 MA, 723 MP, 715, 718, 730; 156/345

[56] References Cited

U.S. PATENT DOCUMENTS

| | | | |
|---|---|---|---|
| 4,499,853 | 2/1985 | Miller | 118/725 |
| 4,566,403 | 1/1986 | Fournier | 118/718 |
| 4,834,023 | 5/1989 | Saitoh et al. | 118/715 X |
| 4,951,602 | 8/1990 | Kanai | 118/723 X |
| 4,995,341 | 2/1991 | Matsuyama | 118/723 |
| 5,129,359 | 7/1992 | Takei et al. | 118/723 |

FOREIGN PATENT DOCUMENTS 61-37969  2/1986  Japan .

*Primary Examiner*—R. Bruce Breneman
*Assistant Examiner*—Jonathan D. Baskin
*Attorney, Agent, or Firm*—Fitzpatrick, Cella, Harper & Scinto

[57] ABSTRACT

A deposited film-forming apparatus comprising a reaction chamber capable of maintaining at a reduced pressure, means for arranging a substrate on which a film is to be formed in said reaction chamber, a gas feed means for supplying a gaseous raw material into said reaction chamber and means for introducing a microwave energy into said reaction chamber, characterized in that said gas feed means is arranged in the space circumscribed by said substrate, said gas feed means comprises a multiple pipe structure, said multiple pipe structure being connected to a gas supply source for supplying said gaseous raw material, the respective constituent pipes of said multiple pipe structure being provided with a plurality of gas spouting holes such that said gas spouting holes are in communication with each other, and means for applying a bias voltage between said substrate and said gas feed means.

8 Claims, 11 Drawing Sheets

FIG. 6
FIG. 7
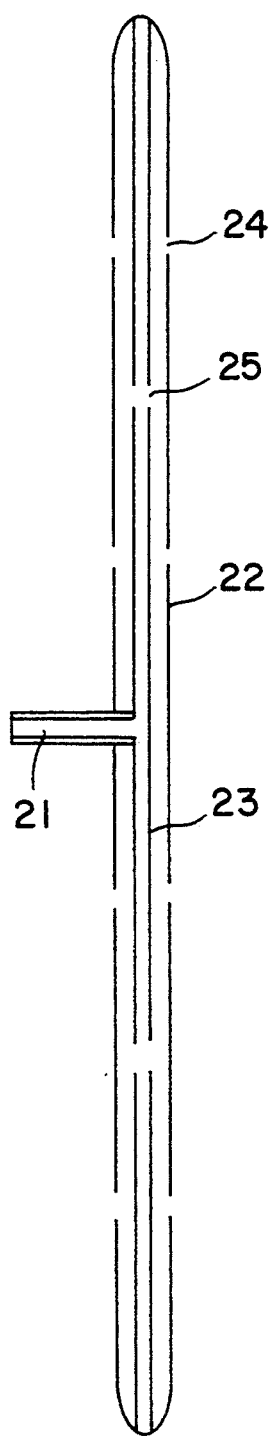
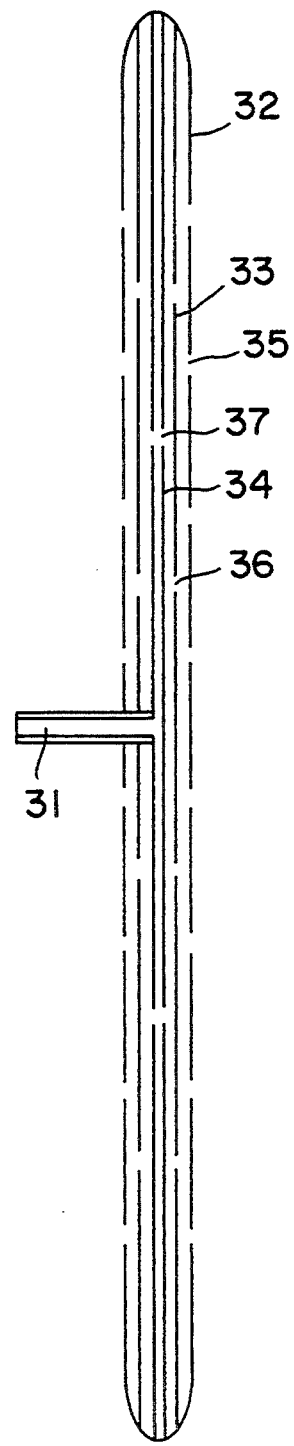

MICROWAVE PLASMA CVD APPARATUS COMPRISING COAXIALLY ALIGNED MULTIPLE GAS PIPE GAS FEED STRUCTURE

This application is a continuation of application Ser. No. 07/820,644 filed Jan. 21, 1992, now abandoned.

FIELD OF THE INVENTION

The present invention relates to a microwave plasma CVD apparatus for forming a deposited film, particularly a non-single crystal semiconductor film which is usable in semiconductor devices, electrophotographic photosensitive devices, image input line sensors, image pickup devices, photovoltaic devices, and the like.

BACKGROUND OF THE INVENTION

In recent years, there have been proposed a number of amorphous semiconductor films comprised of amorphous silicon materials compensated with hydrogen atoms or/and halogen atoms such as fluorine or chlorine atoms (hereinafter referred to as "A-Si(H,X)") as element members to be used in semiconductor devices, electrophotographic photosensitive devices, image input line sensors, image pickup devices, photovoltaic devices, and other than these, various electronic devices, optical elements, and the like. Some of such films have been put to practical use.

It is known that such semiconductor deposited films may be obtained by means of a plasma CVD process, that is, a process of forming a deposited film on a substrate of glass, quartz, heat-resistant resin, stainless steel or aluminum by decomposing a film-forming raw material gas with the action of glow discharge energy of direct current, high frequency energy, microwave, etc. A variety of apparatus for practicing such process have been proposed. In recent years, the public attention has been focused on the plasma CVD process by the microwave glow discharge decomposition technique, and various studies have been made in order to practice said process on the industrial scale. The MW-PCVD method is remarkably advantageous over other methods in that film deposition rate is high and utilization efficiency of a film-forming raw material gas is high.

A typical CVD apparatus by the microwave glow discharge decomposition process is disclosed in Japanese Laid-open patent application 59-078528. While the Japanese Laid-open patent application 61-283116 discloses an improved microwave plasma CVD apparatus, it also discloses a process of performing film deposition while controlling the potential of plasma in the discharge space by applying a desired voltage through an electrode disposed in the discharge space to control ion bombardment of depositing species. This literature describes that the property of a film to be formed according this process is substantially improved.

The deposited film-forming apparatus by such known microwave plasma CVD process is typically of the constitution shown in FIG. 1.

The apparatus shown in FIG. 1 is of the type that a single substrate is placed.

In FIG. 1, reference numeral 401 stands for a reaction vessel having a vacuum tight structure. Reference numeral 402 stands for a dielectric window made of a material capable of efficiently transmitting a microwave power and of maintaining vacuum-tightness such as quartz glass, alumina ceramics or the like. Reference numeral 403 stands for a microwave transmitting portion comprising a metallic waveguide connected to a microwave power source (not shown) through a stub tuner (not shown) and an isolator (not shown). Reference numeral 404 stands for an exhaust pipe which is open into the vacuum vessel 401 through one end thereof, whereas the other end thereof is connected to an exhaust device (not shown). Reference numeral 405 stands for a substrate on which a deposited film is to be formed, and reference numeral 406 stands for a discharge space. Reference numerals 409 and 410 respectively stand for a power source and an electrode respectively for controlling the potential of plasma.

The formation of a deposited film in such conventional deposited film-forming apparatus is carried out in the following manner in the case of using the apparatus shown in FIG. 1.

That is, the inside of reaction vessel 401 is evacuated by means of a vacuum pump (not shown) to bring the inner pressure of the reaction vessel 401 to $1 \times 10^{-7}$ Torr or below. Subsequently, the substrate 405 is heated to and maintained at a temperature suitable for the formation of a desired deposited film by the use of a heater installed within a substrate holder 407. Film-forming raw material gas, for example silane gas ($SiH_4$) in the case of forming an amorphous silicon deposited film, is introduced into the reaction vessel 401. Simultaneously with this, the microwave power source (not shown) is switched on to generate a microwave having a frequency of not less than 500 MHZ, preferably 2.45 GHz, followed by transmission through the waveguide 403 and the dielectric window 402 into the reaction vessel 401. In this way, the gas in the reaction vessel 401 is excited and dissociated by means of microwave energy to cause the formation of a deposited film on the surface of the substrate 405.

According to the conventional deposited film-forming apparatus, it is possible to form a relatively thick photoconductive film at a relatively high deposition rate.

However, as for such conventional apparatus, in the case where the formation of a large area film with uniformity in characteristics all over the film is required, for example, as in the case of an electrophotographic photosensitive member, it is not sufficient to meet the reqirement; and other than this, there are other disadvantages to be eliminated particularly in economy of operation.

As for the process of forming a deposited film, U.S. Pat. No. 4,504,518 describes a microwave plasma CVD process with advantages that a relatively high raw material gas utilization efficiency and a relatively high deposition rate can be attained. The technique described in this literature aims at obtaining a good quality deposited film at a low pressure of 0.1 Torr or below and at a high deposition rate by the microwave plasma CVD process.

Likewise, Japanese Laid-open application 60-186849 proposes a technique in order to improve the raw material gas utilization efficiency in the microwave plasma CVD process, and this technique is to establish an inner chamber (that is, discharge space) so as to circumscribe the microwave energy introducing portion.

As for the microwave plasma CVD apparatus, Japanese Laid-open applications 63-57779 and 63-230880 propose respectively an improvement in the raw material gas supply portion. The improvement concerns the introduction of a raw material gas into the discharge space through the space between the adjacent cylindrical substrates using a comb shaped or triangle pole-like shaped gas supply means, and it makes it possible to efficiently introduce the raw material gas into the plasma generation region and to improve the deposition rate of a deposited film.

In accordance with these conventional microwave plasma CVD processes, it is possible to form a relatively thick photoconductive material at a relatively high deposition rate and with a relatively high raw material gas utilization efficiency.

An example of the foregoing deposited film-forming apparatus is of such constitution schematically shown in FIGS. 2 and 3. FIG. 2 is a schematic cross section view illustrating the constitution of the apparatus. FIG. 3 is a schematic cross section view taken along line B–B' in the apparatus shown in FIG. 2.

Referring to FIGS. 2 and 3, reaction chamber 501 is provided integrally with exhaust pipe 504 at the side face thereof, and the other end of the exhaust pipe 504 is connected to an exhaust device. Waveguide 503 is mounted at each of the upper and lower faces of the reaction chamber 501, and one end of each of the two waveguides 503 is connected to a microwave power source (not shown). The other end of each of the two waveguides 503 on the side of the reaction chamber 501 is hermetically provided with a dielectric window 502. Six cylindrical substrates 505 are arranged in parallel with each other so as to circumscribe the central portion of the reaction chamber 501. Each of the cylindrical substrates 505 is held by a rotary shaft 508, and is designed such that it is heated by a heater 507. The cylindrical substrate 505 is rotated around the central axis in the generatrix direction by actuating a motor 509 to rotate the rotary shaft 508 through a reduction gear 508. The space circumscribed by the cylindrical substrates 505 and the opposite dielectric windows 502 in the reaction chamber 501 is discharge space 505. A bias electrode 552 is installed substantially near the central portion of the discharge space 506 such that it is substantially in parallel to each of the cylindrical substrates 505. The bias electrode 552 is connected to a bias power source 512 through a cable 513. A raw material gas feed pipe 551 is arranged in the space between each pair of the adjacent cylindrical substrates 505. Each of the raw material gas feed pipes 551 is of a comb shape and serves to supply a raw material gas into the discharge space 506.

Upon forming a deposited film, for example for an electrophotographic photosensitive member, the reaction chamber 501 is firstly evacuated to a vacuum of less than $1 \times 10^{-7}$ Torr, then the cylindrical substrates are heated to and maintained at a desired temperature by means of the heaters 507. Thereafter, raw material gases, for example, silane gas, etc. in the case of forming an amorphous silicon deposited film, are supplied into the reaction chamber 501 through the raw material gas feed pipes 551. Simultaneously with this, a microwave having a frequency of not less than 500 MHz, preferably 2.45 GHz is introduced into the reaction chamber 501 through the waveguide 503 and the dielectric window 502. As a result, glow discharge is caused in the discharge space 506 to excite and dissociate the raw material gases, whereby forming a deposited film on each of the cylindrical substrates 505. In this case, the motors 509 are actuated to rotate the cylindrical substrates and by this, the deposited film is formed on the entire surface of each of the cylindrical substrates 505.

However, there are some disadvantages necessary to be eliminated in the conventional microwave plasma CVD technique as will be described hereafter.

That is, in the case of externally supplying a raw material gas, as the raw material gas is introduced into the plasma region, decomposition and ionization are caused from one to another, wherein the radical density and the ion density of the raw material gas in the plasma in the upstream side (the side where the raw material gas is introduced) are markedly different from those in the downstream side (the exhaust means side).

Because of this, the volume and the intensity of ion bombardment on the substrate in the upstream side becomes different from those in the downstream side to unavoidably cause nonuniformity in the thickness and the electric property of a deposited film formed.

In addition, as for the raw material gas, since it is externally supplied into the plasma region, part of the raw material gas is occasionally exhausted without being decomposed because it does not pass through the intense central portion of the plasma region. Thus, there is also a disadvantage to be eliminated with respect to the raw material gas.

Further, since the raw material gas is externally supplied outside the plasma region as above described, ionization thereof is performed mostly at the position remote from the bias electrode. Because of this, the ion energy is not sufficiently high as against the substrate, wherein ion bombardment against the substrate does not sufficiently occur. In this case, if the voltage of the bias electrode is heightened in order to sufficiently cause ion bombardment, abnormal discharges such as sparking and the like are caused.

On the other hand, in the case where a raw material gas feed means is installed within the portion where plasma is generated, the raw material gas always passes through the central portion of plasma and is always decomposed. The electric field in the plasma becomes disturbed by the raw material gas feed means and also by the flow of the raw material gas. Because of this, the deposited film formed on the substrate often becomes poor in uniformity of thickness and also in electrical property.

This problem becomes significant in the case where the above idea is employed in such apparatus as shown in FIGS. 2 and 3 in which a plurality of substrates are arranged so as to circumscribe the plasma region.

Further, in the case of the foregoing conventional apparatus, a problem often occurs in that since the gas feed pipes are situated to be close substrates, minute foreign matters deposited on those gas feed pipes fly up to enter into the reaction chamber and deposit on the substrates when the raw material gas is supplied into the reaction chamber. For instance, when producing an electrophotographic photosensitive member, this leads to defects on an image obtained. In addition, when forming a deposited film continuously over a long period of time, there occur such problems that the deposition rate is reduced as the film formation proceeds together with production of the minute foreign matters. These problems must be eliminated.

SUMMARY OF THE INVENTION

It is an object of the present invention to overcome the foregoing problems in the Conventional apparatus and to provide a microwave plasma CVD apparatus by microwave plasma CVD process which enables one to form an element member usable in semiconductor devices, electrophotographic photosensitive devices, image input line sensors, image pickup devices, photovoltaic devices, other various electronic devices, optical elements, and the like and which enables one to form a homogenous and uniform film at a high deposition rate while markedly improving the raw material gas utilization efficiency.

The present inventors made extensive studies in order to overcome the foregoing problems in the conventional microwave plasma CVD apparatus and in order to attain the above object. As a result, they discovered that the foregoing problems can be eliminated by designing the apparatus such that the raw material gas feed means is arranged within the discharge space and a bias voltage is applied to the raw material gas feed means so as to provide an electric field between the raw material gas feed means and the substrate.

The present inventors further discovered that when a concentric multiple pipe comprising at least an outer pipe provided with a plurality of gas spouting holes which is capable of serving as the bias voltage applying means and an internal pipe arranged in the inside of the outer pipe is used as the raw material gas feed means, the problem relative to the gas spouting means becoming clogged with minute foreign matter and the problem relative to the occurrence of powdery products in the prior art can be desirably eliminated.

The present invention has been accomplished based on this information. The present invention provides an improved microwave plasma CVD apparatus.

The microwave plasma CVD apparatus to be provided according to the present invention is of the constitution as will be described hereafter.

A deposited film-forming apparatus comprises a reaction chamber capable of maintaining at a reduced pressure, means for arranging a substrate on which a deposited film is to be formed in said reaction chamber, a gas feed means for supplying a raw material gas into said reaction chamber and means for introducing a microwave energy into said reaction chamber, characterized in that said gas feed means is arranged in the space circumscribed by said substrate, said gas feed means comprises a concentric multiple pipe structure connected to a supply source for said raw material gas, the respective constituent pipes of said multiple pipe structure are provided with a plurality of gas spouting holes such that said gas spouting holes are in communication with each other, and said multiple pipe structure is provided means for applying a bias voltage between the substrate and the gas feed means.

As above described, the deposited film-forming apparatus according to the present invention is characterized by having the raw material gas feed means comprising the multiple pipe structure, the respective constituent pipes of the multiple pipe structure being provided with a plurality of gas spouting holes, and means for applying a bias voltage between the substrate and the raw material gas feed means. Because of this, the foregoing problems in the prior art are eliminated and such advantages as will be under described are provided.

In the following, explanation will be made of a double pipe as the multiple pipe, but this is merely for illustrative purposes.

In the apparatus of the present invention, the raw material gas from the raw material gas supply source is initially entered into the inner pipe of the double pipe structure (multiple pipe structure). The gas spouting holes of the inner pipe are not directly exposed to the plasma since the outer pipe is situated around the internal pipe. Therefore, there is not any occasion for the raw material gas to be decomposed around those gas spouting holes of inner pipe and no deposition of a film occurs here. Therefore, the gas spouting holes of the internal pipe are never clogged. The raw material gas is distributed uniformly in the axis direction because the inner pipe passes through the space between the inner pipe and the outer pipe and is spouted into the discharge space through the gas spouting holes of the outer pipe. In this case, although the outer pipe is heated because of the plasma and also because of the bias current, the pressure in the space between the inner pipe and the outer pipe is markedly lowered in comparison with the pressure in the single structure pipe as the raw material feed means in the prior art. As a result, film deposition on the outer pipe and the inside face thereof is markedly reduced in comparison to that in the case of the single structure pipe. In addition, the size of the gas spouting hole mounted at the outer pipe can be made relatively large. In this connection, even if a certain change should occur at the gas spouting hole of the outer wall because of film deposition thereon, the film deposited on the substrate never becomes uneven in the axis direction.

Further in the present invention, by properly controlling the bias voltage to be applied between the raw material gas feed means and the substrate, the supply of ions to the film deposited on the substrate can be properly controlled, and as a result, the characteristics of the deposited film are improved as desired. In addition, film deposition on the exterior of the raw material gas feed means can be prevented by applying the bias voltage as above described.

That is, the above effects are promoted when the spatial change of the pressure is made relatively gentle by using the multiple pipe and by shifting the position where the pressure is changed (that is, the gas spouting hole) and the position where the electric field is changed.

DESCRIPTION OF THE PREFERRED EMBODIMENTS

In the following, explanation will be made of embodiments of the microwave plasma CVD deposited film-forming apparatus according to the present invention with reference to the drawings. It should be understood that the following embodiments are merely for illustrative purposes and therefore, the deposited film-forming apparatus according to the present invention is not limited to these embodiments and may be properly modified as desired other than these embodiments as long as the object of the present invention can be attained.

FIG. 4 is a schematic cross section view illustrating an example of the constitution of the deposited film-forming apparatus according to the present invention.

FIG. 5 is a schematic cross section view taken along line A–A' in the apparatus shown in FIG. 4.

FIG. 6 is a schematic longitudinal section view illustrating the constitution of a concentric double pipe structure as the raw material gas feed pipe in the apparatus according to the present invention. FIG. 7 is a schematic longitudinal section view illustrating the constitution of a concentric triple pipe structure as the raw material gas feed pipe in the apparatus according to the present invention.

In the figure, a cylindrical reaction chamber 1 having a vacuum tight structure is provided integrally with an exhaust pipe 4 at a side wall thereof. The residual end of the exhaust pipe 4 is connected to an exhaust device such as a vacuum pump (not shown). Each of the upper and lower walls of the reaction chamber 1 is provided with a waveguide 3 at the central position thereof. The waveguide 3 comprises a portion having a rectangular cross section (not shown) which is extending from a microwave power source 112 to the position in the vicinity of the reaction chamber 1 and a portion having a circular cross section (not shown) which is situated in the reaction chamber 1. The waveguide 3 is connected to the microwave power source 112 through a stub tuner (not shown) and an isolator (not shown). The end portion of each of the opposite waveguides 3, which is situated in the reaction chamber 1, is provided with a dielectric window 2 made of a material capable of efficiently transmitting a microwave energy without leakage thereof and of maintaining vacuum tightness. Particularly, the dielectric window 2 is constituted by alumina ($Al_2O_3$), aluminum nitride (AlN), boron nitride (BN), silicon nitride (SIN), silicon carbide (SIC), silicon oxide ($SiO_2$), beryllium oxide (BeO), polytetrafluoroethylene, polystyrene, or the like. The dielectric window 3 is hermetically contacted with the cylindrical portion of the waveguide 3 so that the atmosphere in the reaction chamber 1 is independently maintained. In the reaction chamber 1, six cylindrical substrates 5 are arranged in parallel with each other so as to circumscribe the central portion of the reaction chamber 1. Each of the cylindrical substrates 5 is held by an independent rotary shaft 8 and it has a cylindrical heater 7 coaxially installed therein such that the cylindrical heater serves to heat the cylindrical substrate from the rear side thereof. Each of the rotary shafts 8 is rotatably fixed to the reaction chamber 1, and it is connected to a driving motor through a reduction gear 10. The cylindrical substrate 5 is rotated around the central axis in the generatrix direction by actuating the driving motor 9.

The portion circumscribed by the respective cylindrical substrates 5 and the respective dielectric windows 2 in the reaction chamber 1 denotes a discharge space 6. Upon introducing microwave into the reaction chamber 1 through the respective waveguides and the respective dielectric windows, glow discharge by the microwave is caused mainly in the discharge space 6. The discharge space 6 is desired to be designed such that it functions as a cavity resonator. Reference numeral 11 indicates a raw material gas feed means, the constitution of which will be later described, which is arranged at the central position of the discharge space 6 and in parallel to each of the cylindrical substrates 5. The raw material gas feed means 11 is connected to a gas supply conduit 16. The gas supply conduit 16 is made of an electrically insulating material, and it is connected to a raw material gas supply source (not shown) through a gas inlet port 15. Reference numeral 13 indicates a cable extended from a bias power source 12. The cable 13 is inserted into the inside of the gas conduit 16 through a terminal 14 and is connected to the raw material gas feed means 11. Hence, a bias voltage can be applied between the gas feed means 11 and the respective cylindrical substrates 5.

Explanation will be made of the gas feed means 11. The raw material gas feed means 11 comprises a multiple pipe structure at least having a surface composed of a conductive material. The innermost pipe thereof is connected to the gas supply conduit 16. The respective constituent pipes of the multiple pipe structure are provided with a plurality of gas spouting holes such that the raw material gas flows from the inside to the outside. In this case, to make the number of the gas spouting holes mounted at the outermost pipe to be greater than the number of the gas spouting holes mounted at the pipe situated inside the outermost pipe is desirable, since a uniform pressure distribution of the raw material gas is provided in the discharge space 6 to thereby make the resulting deposited film to be uniform in characteristics. In addition, it is desired for the gas spouting holes of the inner pipe not to be overlapped to the gas spouting holes of the outer pipe.

As for the shape of the raw material gas feed means, there is not any particular restriction. However, in the case where a sharp edge portion at the exterior of the outermost pipe, a film deposited thereon is liable to peel off. With a view of preventing occurrence of such film peeling, the shape of the raw material gas feed means is desired to be in a cylindrical form or in a form similar thereto.

In the case where the raw material gas feed means is of a double pipe structure, the inner pipe is desired to be such that the shape is in a cylindrical form and the cross sectional diameter is of a size corresponding to 30 to 70% of that of the outer pipe. There is not any particular restriction also for the length of the raw material gas feed means. However, to prevent unevenness in the thickness of a deposited film obtained, it is desired to be of a size corresponding to 90 to 110% of the length of the substrate.

As for the material by which the raw material gas feed means, it is desired to use such a material that provides a conductive surface and is substantially poor in thermal conductivity. Specifically, there can be used, for example, metals such as stainless steel, Ni, Cr, Mo, In, Nb, Te, V, Ti, Pt, Pd, Fe, etc. alloys of these metals, glass or ceramics applied with conductive treatment to the surface thereof, or the like.

The position at which the raw material gas feed means is installed in terms of a horizontal plane may be at any position as long as the distance between the center of the discharge space and the central axis of the raw material gas feed means is corresponding to 20% or less of the minimum distance between the center of the discharge space and the substrate. In a preferred embodiment, the raw material gas feed means is desired to be arranged at the central position of the discharge space in view of attaining uniformity in the thickness and quality for a deposited film obtained.

In the case where the raw material gas feed means is made to be of a cylindrical form, the diameter thereof is made to be preferably a size corresponding to 4 to 25% or more preferably a size corresponding to 4 to 14% respectively of the diameter of the discharge space as apparent from what will be later described.

As for the diameter of each of the gas spouting holes of the outermost pipe, it is desired to be preferably about 0.4 to about 2.5 mm or more preferably, about 0.6 to about 1.5 mm as apparent from what will be later described.

As for the number of the gas spouting holes disposed at the outermost pipe in terms of the number per unit exterior area, it is preferably 0.09 to 0.31/$cm^2$ or more preferably, 0.14 to 0.27/$cm^2$ as apparent from what will be later described.

As for the positional relationship among the gas spouting holes, those gas spouting holes are desired to be properly arranged with due care so that the path length of the raw material gas during the period of time when the raw material gas is introduced into the multiple pipe structure, passes through the inside thereof and is spouted into the reaction chamber becomes substantially the same with respect to each of the gas spouting holes of the outer most pipe. In this case, a uniform film can be obtained even in the case where the composition of the raw material gas is changed during film formation.

Shown in FIG. 6 is an example of the constitution of the raw material gas feed means 11 comprising a double pipe structure. In this case, the double pipe structure comprises an inner pipe 23 and an outer pipe 22 and is connected to the gas conduit 16 through a connector 21. The inner pipe 23 and the outer pipe 22 are respectively provided with a plurality of gas spouting holes 25, 24. The number of the gas spouting holes of the outer pipe is made to be greater than that of the inner pipe. The raw material gas firstly flows into the inner pipe 23 from the connector 21, passes through the gas spouting holes 25 of the inner pipe into the outer pipe 22 and flows into the discharge space 6 through the gas spouting holes 24 of the outer pipe.

Likewise, shown in FIG. 7 is of an example of the constitution of the raw material gas feed means 11 comprising a triple pipe structure. In this case, the triple pipe structure comprises an inner pipe 34, a middle pipe 33 and an outer pipe 32 and is connected to the gas conduit 31 through a connector 21. The inner pipe 34, the middle pipe 33 and the outer pipe 32 are respectively provided with a plurality of gas spouting holes 37, 36, 35. The number of the gas spouting holes of the outer pipe is made to be greater than that of the middle pipe, and the number of the gas spouting holes of the middle pipe is made to be greater than that of the inner pipe. The raw material gas firstly flows into the inner pipe 34 from the connector 31, passes through the gas spouting holes 37 of the inner pipe into the middle pipe 33, passes through the gas spouting holes 36 of the middle pipe into the outer pipe 32 and flows into the discharge space 6 through the gas spouting holes 36 of the outer pipe.

The shape of the raw material gas feed means in the present invention is not limited to those shapes shown in FIGS. 6 and 7 but may take other appropriate shapes. For example, the position at which the connector is to be disposed is not at the position in contrast with the central portion of the multiple pipe structure but may be at the upper end position or at the lower end position of the multiple pipe structure. Other than this, the system of introducing the raw material gas into the multiple pipe structure may be designed such that plural kinds of gases can be introduced into the multiple pipe structure through a single introduction or through a plurality of introduction routes.

In the above, in addition to the multiple pipe structure into which innermost pipe the raw material gas is introduced, it is possible to introduce a raw material gas into a pipe other than the innermost pipe, to thereby mix the gases and supply the gas mixture into the reaction chamber through the gas spouting holes of the outermost pipe.

The position through which the raw material gas is introduced into the gas feed means should be properly determined with due care so that the raw material gas can be supplied into the reaction chamber with a homogeneous composition and in a uniform state. In a most desirable embodiment, the raw material gas is desired to be introduced into the innermost pipe through one position as shown in FIGS. 6 and 7.

As for the shape of the raw material gas feed means, especially the shape of the outermost pipe thereof in the present invention, there is not any particular restriction, but it is the most appropriate to be of a cylindrical form. As for the cross sectional diameter of the outermost pipe in the present invention, it is preferably 3 mm or more and most preferably, 5 to 20 mm.

Likewise, as for the length of the outermost pipe, there is not any particular limitation as long as an electric field is uniformly provided to the substrate upon applying a bias voltage to the outermost pipe and the raw material gas is uniformly distributed onto the surface of the substrate which is exposed to the plasma. However, in the case of the microwave plasma CVD apparatus shown in FIG. 4, the outermost pipe is usually designed to be of a length equivalent to the length of the substrate or a length which is about 0.1 to 50 mm longer than the length of the substrate.

As for the gas spouting holes of the outermost pipe, it is desired for them to be designed such that they have a plurality of gas spouting directions, and in a preferred embodiment, they are desired to be arranged such that they face toward the substrates and are distributed along the entire discharge space. Alternatively, the outermost pipe is constituted by a..porous material so that the raw material gas can be spouted in all the directions.

In the apparatus according to the present invention, the electric field to be provided between the outermost pipe and the substrates is desired to be a DC electric field, and the direction of the electric field is desired to face toward the substrates from the outermost pipe side. The magnitude of a DC voltage to be applied to the raw material gas feed means in order to provide the DC electric field between the outermost pipe and the substrates is preferably in the range of 15 V to 300 V or more preferably, in the range of 30 V to 200 V. As for the waveform of the DC voltage to be applied to the raw material gas feed means in order to provide the DC electric field, there is not any particular limitation therefor. That is, it may take any waveform as long as the direction of the voltage is not changed with the lapse of time. Specifically, not only constant voltage which is not changed in the magnitude according to the lapse of time but also pulse-like voltage and pulsating voltage rectified by a rectifier can be selectively used.

In the present invention, it is possible to apply an alternate current. In this case, as for the frequency thereof, there is not any particular restriction, however, it is preferred to be 20 Hz or above. Specifically, 50 Hz or 60 Hz is desirable in the case of low frequency, and in the case of high frequency, 13.56 MHz is desirable. As for the waveform of the alternate current, sine wave, rectangular wave or other appropriate waveforms may be employed, but among these waveforms, sine wave is the most appropriate. The voltage in any case denotes an effective value.

According to the apparatus of the present invention, there are provided such advantages as will be under described.

In the apparatus having the foregoing constitution according to the present invention, the raw material gas feed means is situated within the discharge space, the raw material gas introduced is excited and dissociated with the action of microwave energy until it arrives at the substrates wherein electrons accelerated by the electric field and having large energy are present around the raw material gas feed means and in the entire region of the discharge space, and the excitation and the decomposition are efficiently performed. As a result, the raw material gas utilization efficiency is markedly heightened. And the raw material gas when arrived at the substrates has been converted into sufficiently decomposed precursors having high energy and which are high in surface mobility on the substrates. Because of this, a deposited film of low internal stress is formed on each of the substrates. In addition, the ions caused by ionization with the action of the plasma are sufficiently accelerated with the action of the electric field provided by applying the bias voltage to the raw material gas feed means itself to have high kinetic energy and cause ion bombardment on each of the substrates. Because of this, local annealing is carried out for the film deposited even with a relatively low voltage on the raw material gas feed means. Hence, the stress in the film is effectively relaxed to reduce defects thereof, and as a result, the resulting deposited film becomes such that it excels in characteristics.

The bias voltage applied to the raw material gas feed means may be applied to the outermost pipe thereof or to the pipe situated inside the outermost pipe. In a preferred embodiment, the exterior of the outermost pipe is made to be of a predetermined bias potential and other pipe(s) situated inside the outermost pipe is made to be of a potential equivalent to the former or to be in a floating state.

In the above explanation, as the shape of the reaction chamber to be used in the microwave plasma CVD apparatus of the present invention, there has been mentioned a cylindrically shaped one as shown in FIG. 5, but it is not limited only to this. It may be in the form of a rectangular shape or in the form of a rectangular shape provided with a curved wall at part thereof.

The inner pressure of the reaction chamber upon carrying out film formation using the apparatus of the present invention is desired to be preferably 100 mTorr or below or more preferably, 50 mTorr or below in view of providing significant effects.

As the substrate on which a deposited film is to be formed, either rigid or flexible conductive members or members applied with conductive treatment to their surface may be selectively used. Specific examples of such members are metals such as stainless steel, Al, Cr, Mo, Au, In, Nb, Te, V, Ti, Pt, Pd, Fe, etc., alloys of these metals, members comprising synthetic resins such as polycarbonate which have been applied with conductive treatment to their surface, and members comprising glass or ceramics or paper which have been applied with conductive treatment to their surface.

The substrate may be of any configuration such as plate-like, belt-like or cylindrical shape which can circumscribe the discharge space by one or more of such member.

In the case of using a cylindrical member as the substrate, there is not any particular restriction as for the diameter thereof. However, in general, it is desired to be such that is of 20 to 500 mm in diameter and of 10 to 1000 mm in length. A plurality of such cylindrical members are desired to be arranged in the reaction chamber so as to leave a space of 1 to 50 mm in distance between each pair of the adjacent cylindrical substrates in view of stably maintaining the discharge space. The number of the substrates to be arranged should be properly determined so that a desirable discharge space is established. However, in general, it is desired to be at least three or more preferably at least four.

In the case of using a belt-like shaped member as the substrate, it is desired to establish a cylindrical space by curving said member.

Explanation will be made of the manner of heating the cylindrical substrates 5.

Each of the cylindrical substrates 5 is heated by means of the corresponding heater 7. As the heater 7, any heater may be used as long as it can maintain vacuum tightness. Specifically, electric resistance heat generating bodies such as sheath-like winding heater, plate-like heater, etc., heat radiation lamp heat generating bodies such as halogen lamp, infrared lamp, etc., or heat transfer means using air or liquid as the heat transfer medium can be selectively used. The surface of the heater 7 is desired to be constituted by a metal such as stainless steel, Ni, Al, Cu, etc., ceramics, or heat resistant resin. The heater 7 may be replaced by a heating chamber disposed outside the reaction chamber 1. In this case, the cylindrical substrates 5 are heated in the heating chamber, followed by transferring them into the reaction chamber 1 under vacuum condition. It is possible to control the cylindrical substrates 5 to be of a predetermined temperature by utilizing the microwave to be used for causing glow discharge either independently or in combination with any of the above substrate heating manners. In this case, the intensity of the microwave is properly controlled.

Explanation will be made of the raw material gas used.

As the deposited film-forming raw material gas, there can be mentioned, for example, amorphous silicon deposited film-forming raw material gases such as silane ($SiH_4$), disilane ($Si_2H_6$), etc., other functional deposited film-forming raw material gas such as germane ($GeH_4$), methane ($CH_4$), etc., and mixtures of these gases.

It is possible to use appropriate dilution gas for such deposited film-forming raw material gas. Specific examples of such dilution gas are hydrogen gas ($H_2$), argon gas (Ar), helium gas (He), neon gas (Ne), etc.

In the case of forming a deposited film such as amorphous silicon deposited film, it is possible to use an appropriate property-improving gas capable of contributing to grading the band gap or of contributing to forming stable bonds. Specific examples of such property-improving gas are nitrogen atom-containing compounds such as ammonia ($NH_3$), nitrogen gas ($N_2$), etc., oxygen atom-containing compounds such as oxygen gas ($O_2$), nitrogen monoxide (NO), dinitrogen monoxide ($N_2O$), etc., hydrocarbons such as methane ($CH_4$), ethane ($C_2H_6$), ethylene ($C_2H_4$), acetylene ($C_2H_2$), propane ($C_3H_8$), etc., and fluorine compounds such as silicon tetrafluoride ($SiF_4$), silicon hexafluoride ($Si_2F_6$), germanium tetrafluoride ($GeF_4$), etc. These gases may be used in combination.

The present invention is also effective in the case where a doping gas such as diborane ($B_2H_6$), boron trifluoride ($BF_3$), phosphine ($PH_3$), etc. is introduced into the discharge space simultaneously with the raw material gas in order to dope a deposited film obtained with a dopant.

As for the pressure in the discharge space, there is not any particular restriction. However, in general, in order to obtain a good result with good reproducibility, it is desired to be preferably 100 mTorr or below or most preferably, 50 mTorr or below.

Explanation will be made of the operation of the apparatus above described.

At first, the reaction chamber 1 is evacuated through the exhaust pipe 4 to bring the inside to a vacuum of less than $1 \times 10^{-7}$ Torr by means of the exhaust device 104. Then, each of the cylindrical substrates 5 is heated to and maintained at an optimum temperature by the heater 7. In the case of forming an amorphous silicon deposited film for example, raw material gases such as silane are introduced through the gas inlet port 15, followed by flowing into the raw material gas feed means 11 through the gas conduit 16 and spouting into the discharge space 6 from the raw material gas feed means 11. Simultaneously with this, a DC bias voltage for example is applied to the raw material gas feed means 11 by means of the bias power source 12. At the same time, a microwave of 500 MHz or above, specifically, 2.45 GHz in frequency is generated by actuating the microwave (not shown) and the microwave is introduced into the reaction chamber 1 through the waveguide 3 and the dielectric window 2. By this, microwave glow discharge is started in the discharge space 6 circumscribed by the cylindrical substrates 5, wherein the raw material gases are excited and dissociated and ions are constantly supplied onto each of the cylindrical substrates 5 by an electric field provided between the raw material gas feed means 11 and the cylindrical substrates 5, whereby a deposited film is formed on the surface of each of the cylindrical substrates 5. In this case, by rotating each of the cylindrical substrates 5 around the central axis in the generatrix direction by rotating the rotary shaft 8 by means of the driving motor 9, a uniform deposited film is formed on the entire surface of each of the cylindrical substrates.

Explanation will be made of the results obtained in the experiments which were carried out the deposited film-forming apparatus in the above embodiments.

Experiment Example 1

A plurality of deposited films were formed in the case of using the double pipe structure shown in FIG. 6 as the raw material gas feed means and also in the case of using a single pipe structure shown in FIG. 8 as the raw material feed means. In each of the two cases, the deposited films were formed under the conditions of introducing into the discharge space silane gas ($SiH_4$) at 600 sccm (sccm means a flow rate indicated by $cm^3$ per a minute when converted to 0° C., 1 atmospheric pressure), introducing a microwave of 600 W through each of the upper and lower dielectric windows, and varying the bias voltage to be applied.

The single pipe structured raw material feed means shown in FIG. 8 is designed such that the raw material gas is supplied into a single pipe through a connector 41, followed by spouting through a plurality of gas spouting holes 42 into the discharge space.

In each case, the temperature of the exterior of the raw material gas feed means was measured by means of a thermocouple connected to the raw material gas feed means, and the resultant deposited film was observed with respect to the number of spherical protrusions occurred at the surface thereof by means of a optical microscope.

Shown in FIG. 9 are of the results with respect to changes in the temperature of the exterior of the raw material gas feed means, in which the abscissa indicates the film-forming period of time since the start of glow discharge and the ordinate indicates the temperature of the exterior of the raw material gas feed means.

The cylindrical substrates were provisionally heated to 300° C. and used. Because of this, the temperature of the exterior of the raw material gas feed means at the time of starting the experiment was 250° C. As apparent from what shown in the figure, it is understood that both the single pipe structure and the double pipe structure show identical temperature changes, and the temperature of the exterior of the raw material gas feed means rises as the bias voltage to be applied is heightened in any case. It is also understood that the temperature of the exterior of the raw material gas feed means is extremely high, specifically, more than 600° C. upon the application of a bias voltage of 100 V or above.

The foregoing observation with respect to the occurrence of spherical protrusions was performed of each of the deposited films obtained by performing film formation for four hours under the above-mentioned conditions and taking them from the reaction chamber in each case. The observed results obtained were shown in FIG. 10. The observation with respect to the number of the spherical protrusions was performed by enumerating the number of spherical protrusions present in each of selected nine unit areas of $1 cm \times 1 cm$ in size of the deposited film formed on the cylindrical substrate, the first three areas being selected in the circumferential direction at the upper part, the next three areas being selected in the circumferential direction at the middle part and the last three areas being selected in the circumferential direction at the lower part, by using an optical microscope, and totaling the numbers obtained. In the figure, the abscissa indicates the bias voltage applied and the ordinate indicates the mean value per unit area with respect to the number of the spherical protrusions occurred.

As apparent from what shown in the figure, it is understood that the number of spherical protrusions which occurred on any of the deposited films formed under the condition of 0 to 30 V for the bias voltage applied is markedly small, specifically less than $1/cm^2$, not only in the case of the single pipe structure but also in the case of the double pipe structure, and that in the case of 100 V or above as for the bias voltage applied, the number of spherical protrusions which occurred on each of the deposited films formed by using the single pipe structure is markedly increased but the number of spherical protrusions occurring on each of the deposited films formed by using the double pipe structure is substantially not increased. It is known that such spherical protrusion is one of the principal causes of defective images in the case of the electrophotographic photosensitive member. Hence, it is understood that the quality of a deposited film can be markedly improved by using the double pipe structure as the raw material gas feed means.

Experiment Example 2

There were used various double pipe structures respectively of the constitution shown in FIG. 6 as the raw material gas feed means. Using each double pipe structure, a deposited film was formed on the surface of each of the cylindrical substrates by introducing silane gas ($SiH_4$) into the discharge space at 600 sccm wherein a bias voltage of 120 V was applied and at the same time, a microwave energy of 800 W was introduced through each of the upper and lower dielectric windows to maintain glow discharge for four hours. The double pipe structures used herein were such that are 350 mm for the length of the outer pipe, 1.2 mm for the diameter of each of the gas spouting holes of the outer and inner pipes and 24 for the total number of the gas spouting holes and that are different with respect to the diameter of the outer pipe. The discharge space was 127 mm in diameter (the distance between the central axis to the opposite cylindrical substrate). As for each of the deposited amorphous silicon films formed under these conditions, the variation in thickness to the mean film thickness and the stability of glow discharge were observed. The observed results obtained were shown in Table 1.

In Table 1, the film deposition rate was obtained based on the ratio with respect to the thicknesses of the resultant deposited films since the film-forming period of time was the same in all the cases. The film thickness was obtained by measuring the film thickness at each of the 3 cm spaced positions in the up-and-down direction and also in each of the three circumferential directions with respect to the cylindrical substrate by means of a film thickness measuring device by excess current (trademark name: TYPE EC 8e2TY, product by Fischer Company). Each of the values thus obtained relative to the film thickness was shown as a relative value to the value relative to the film thickness of the deposited film obtained when the outer diameter (the diameter of the outer pipe) was 6 mm, which was made to be 100%. As for the discharge stability, observation thereof was performed visually, and the observed results were shown by the following marks; ⊙ indicating the case where glow discharge was stably maintained during the period of four hours, ○ indicating the case where spark sometimes occurred, Δ indicating the case where glow discharge sometimes extinguished, and X indicating the case where extinction of glow discharge often occurred and glow discharge could not be maintained and therefore, film formation was not completed.

The unevenness (variation) in thickness in the table was obtained by measuring the film thickness at each of the 3 cm spaced positions in the up-and-down direction of the cylindrical substrate to obtain the maximum film thickness and the minimum film thickness and dividing the difference by the mean film thickness.

Further, observation was performed based on all the above results, and the results obtained were in the column "total evaluation" in the table.

As apparent from what shown in the table, it is understood that in the case where the raw material gas feed means is of a cylindrical form, the diameter thereof is desired to be preferably 4% to 25% or more preferably, 4% to 14% over the diameter of the discharge space.

Particularly, as for the raw material gas feed means, film deposition is occurred also on the exterior thereof and because of this, the raw material gas utilization efficiency is decreased to a certain extent when its outer diameter is enlarged. In addition, in the case where the raw material gas feed means of a large size is installed in the discharge space, the microwave to be introduced into the discharge space comes to the result that it is often reflected and as a result, glow discharge is disturbed and stable formation of plasma is hardly occurred. On the other hand, in the case where the outer diameter is excessively small, the uniformity of the resulting deposited film in the up-and-down direction is decreased to a certain extent. It is difficult to precisely used a narrowed double pipe structured raw material feed means.

From what above described, it is considered that the double pipe structure of an outer diameter in the above-mentioned range is suitable for the present invention.

Experiment Example 3

There were used various double pipe structures respectively of the constitution shown in FIG. 6 as the raw material gas feed means. Using each double pipe structure, a deposited film was formed on the surface of each of the cylindrical substrates by introducing silane gas ($SiH_4$) into the discharge space at 600 sccm wherein a bias voltage of 120 V was applied and at the same time, a microwave energy of 800 W was introduced through each of the upper and lower dielectric windows to maintain glow discharge for four hours. The double pipe structures used herein were such that are different with respect to the size of the gas spouting hole of the outer pipe. As for each of the deposited amorphous silicon films formed using the various raw material gas feed means, the variation (unevenness) in thickness in the up-and-down direction of the cylindrical substrate was observed the foregoing film thickness measuring device. The observed results obtained were collectively shown in FIG. 11. In the figure, the abscissa indicates the size of the gas spouting hole of the outer pipe and the ordinate indicates the variation in thickness.

In the cases where the size of the gas spouting hole of the outer pipe was 0.5 mm or below, it was found after film formation that some of the gas spouting holes of the outer pipe are substantially filled up with films deposited on the exterior of the raw material gas feed means.

As apparent from the results obtained, it is understood that the uniformity in thickness is reduced either in the case where the size of the gas spouting hole is excessively small or in the case where the size of the gas spouting hole is excessively large. As the reason for this, it is considered that the gas spouting hole is filled up with deposited film when the size thereof is excessively small and a pressure difference is hardly provided from the raw material gas feed means toward the discharge space and as a result, the uniformity in thickness of the deposited film in the up-and-down direction of the cylindrical substrate is reduced.

From what above described, it is understood that the size (diameter) of the gas spouting hole of the outer pipe is desired to be preferably 0.5 mm to 2.5 mm or more preferably 0.6 mm to 1.5 mm.

Experiment Example 4

The procedures of Experiment Example 3 were repeated, except that various raw material gas feed means different in the density of the gas spouting holes of the outer pipe were used, to thereby form a deposited film on each of the cylindrical substrates in each case.

As for the raw material gas feed means used herein, each of them is of 320 mm for the length of the outer pipe and 12 mm for the diameter of the outer pipe and has three gas spouting holes on an identical circumference. And the density of the gas spouting holes of the outer pipe was varied by changing the distance between each pair of the adjacent gas spouting holes in each case. For all the raw material gas feed means, all the gas spouting holes were made constant at 1.2 mm in diameter.

As for the deposited film obtained in each case, the variation (unevenness) in thickness was observed in the same manner as in the foregoing case. The observed results obtained were collectively shown in FIG. 12. In the figure, the abscissa indicates the density obtained by dividing the number of the gas spouting holes of the outer pipe by the area of the exterior of the raw material gas feed means and the ordinate indicates the variation (unevenness) in thickness. From the results obtained, it is understood that the uniformity in thickness of the resulting film is reduced either in the case where the density of the gas spouting holes is excessively small or in the case where said density is excessively large, and that the density of the gas spouting holes of the outer pipe is preferably $0.09/cm^2$ to $0.31/cm^2$ or more preferably, $0.14/cm^2$ to $0.27/cm^2$.

Experiment Example 5

Using a double pipe structure of the constitution shown in FIG. 6 as the raw material feed means and under the conditions shown in Table 2, there were prepared a plurality of amorphous silicon photosensitive drums by forming a deposited film comprising a charge injection inhibition layer, a photosensitive layer and a surface layer on each of a plurality of aluminum cylindrical substrates. Each of the resultant amorphous silicon photosensitive drums was set to a modification of NP 7550 copying machine (product by Canon Kabushiki Kaisha), which was modified for use in experimental purposes, to thereby form an image on a transfer sheet in accordance with the conventional image-forming process. Observation was made with respect to each of the following evaluation items to thereby evaluate the electrophotographic characteristics of each of the amorphous silicon photosensitive drums. In the above, charging of the photosensitive drum was performed by applying a voltage of 6 V to the charging device. The observed results obtained and total evaluations based on the observed results were collectively shown in Table 3.

(1) charge retentivity

The photosensitive drum was set to the copying machine, wherein the surface potential of the drum was measured at the position of the developing mechanism under the condition of constant charging magnitude while rotating the drum. In this case, the surface potential was measured at each of the 3 cm spaced positions in the up-and-down direction of the drum, and the mean value among the measured results was made to be the charge retentivity of the drum.

This evaluation with respect to the charge retentivity was made for each of the six drums obtained in one film formation. As for the drum which was the largest with respect to a variation in the charge retentivity, evaluation was made with the following criteria.

⊙—less than 10 V, and extremely excellent uniformity,
○—less than 20 V, and excellent uniformity,
Δ—less than 30 V, and practically acceptable, and
X—exceeding 30 V, and insufficient in the case when used in a high speed copying machine in order to obtain a high quality image.

(2) unevenness in sensitivity

In the same manner as in the above, the photosensitive drum was subjected to charging, wherein the surface potential was measured at each of the 3 cm spaced positions in the up-and-down direction of the drum, and the mean value among the measured results was made to be the sensitivity of the drum.

This evaluation was made for each of the six drums obtained in one film formation. As for the drum which was the largest with respect to a variation in the sensitivity, evaluation was made with the following criteria.

⊙—less than 3 V, and extremely excellent uniformity,
○—less than 6 V, and excellent uniformity,
Δ—less than 10 V, and practically acceptable, and
X—exceeding 10 V, and seems to cause reduction in the quality under sever conditions of high temperature and high humidity or of low temperature and low humidity.

(3) minute line reproduction

An original of which white background being filled with characters was put on the original table to obtain an copied image sample in each case. As for each of the resultant copied image samples, evaluation was made of whether or not minute lines were continuous. In this case, when the copied image sample was accompanied with uneven image, the worst portion in the entire copied image area was shown as the evaluated result. This evaluation was made for each of the six drums obtained in one film formation. And as for the drum which was the worst with respect to the result, evaluation was made with the following criteria.

⊙—good,
○—partly broken,
Δ—many broken portions, but characters can be distinguished, and
X—some characters cannot be distinguished.

(4) fogging

An original of which white background being filled with characters was put on the original table to obtain an copied image sample in each case. For each of the resultant copied image samples, evaluation was made of whether or not fogging occurred in the white background. This evaluation was made for each of the six drums obtained in one film formation. As for the drum which was the worst with respect to the result, evaluation was made with the following criteria.

⊙—good,
○—slight fogging partly occurred,
Δ—fogging occurred in the entire region, but characters can be distinguished, and
X—too much fogging and the characters cannot be distinguished.

(5) uneven image

An entirely halftoned original was put on the original table to obtain a copied image sample in each case. As for each of the resultant copied image samples, evaluation was made of whether or not density difference was present. This evaluation was made for each of the six drums obtained in one film formation. As for the drum which was the worst with respect to the result, evaluation was made with the following criteria.

⊙—good,
○—slight density difference is partly present,
Δ—density difference is present in the entire region, but characters can be distinguished, and
X—too much density difference and the characters cannot be distinguished.

(6) defective image

A black original was put on the original table to obtain a copied image sample in each case. As for each of the resultant copied image samples, evaluation was made of the number of white dots in an identical area. This evaluation was made for each of the six drums obtained in one film formation. As for the drum which was the worst with respect to the result, evaluation was made with the following criteria.
⊚—good,
○—minute dots are partly present,
△—white dots are present in the entire region, but characters can be distinguished, and
X—great many white dots are present and the characters cannot be distinguished.

Experiment Example 6

The procedures of Experiment Example 5 were repeated, except that a triple pipe structure of the constitution shown in FIG. 7 was used as the raw material gas feed means, to thereby a plurality of amorphous silicon photosensitive drums. Each of the resultant drums was evaluated in the same manner as in Experiment Example 5.

The evaluated results were collectively shown in Table 3.

Comparative Example 1

The procedures of Experiment Example 5 were repeated, except that a single pipe structure of the constitution shown in FIG. 8 was used as the raw material gas feed means, to thereby a plurality of amorphous silicon photosensitive drums. Each of the resultant drums was evaluated in the same manner as in Experiment Example 5.

The evaluated results were collectively shown in Table 3.

Comparative Example 2

Using the conventional deposited film-forming apparatus and under the conditions shown in Table 2, there were prepared a plurality of amorphous silicon photosensitive drums by forming a deposited film on each of a plurality of aluminum cylindrical substrates. Each of the resultant drums was evaluated in the same manner as in Experiment Example 5.

The evaluated results were collectively shown in Table 3.

As is apparent from the foregoing experimental results, it was found that a deposited film excelling in characteristics can be effectively formed according to the deposited film-forming apparatus of the present invention; and particularly in the case of producing an electrophotographic photosensitive member, the resulting electrophotographic photosensitive member becomes such that provides a desirable copied image excelling in image uniformity with few defects.

As above described, according to the present invention, because the raw material gas feed means comprises a multiple pipe structure, each of which constituent pipes being provided with a plurality of gas spouting holes, and a bias voltage applying means capable of applying a bias voltage between the substrate and the raw material gas feed means is disposed, there can be stably and repeatedly formed a large area and relatively thick deposited film which is homogeneous in quality, excels in optical and electric characteristics and has few defects, particularly in the region where a high film deposition rate is provided, at a high yield and at a reduced production cost.

Since the deposited film-forming apparatus of the present invention makes it possible to form a large area and homogeneous deposited film as above described, there can be prepared uniform semiconductor devices with no variation in characteristics among the elements. As such semiconductor device, there can be mentioned transistors with many elements for matrix driving circuit, light emitting diodes for matrix display, long image input line sensors, image pickup devices, etc. Especially, the present invention makes it possible to prepare an electrophotographic photosensitive member which exhibits excellent electrophotographic characteristics even under sever conditions of high temperature and high humidity which are unsuitable for charging or under severe conditions of low temperature and low humidity.

TABLE 1

| outer diameter | 6 mm | 9 mm | 12 mm | 18 mm | 26 mm | 32 mm | 40 mm |
|---|---|---|---|---|---|---|---|
| outer diameter diameter of the discharge space | 4.7% | 7.1% | 9.4% | 14% | 20% | 25% | 31% |
| film deposition rate | 100% | 98% | 95% | 90% | 75% | 60% | X |
| discharge stability | ⊚ | ⊚ | ⊚ | ⊚ | ○ | △ | X |
| unevenness in thickness | 7.5% | 5.8% | 2.0% | 6.5% | 10.2% | 18.4% | X |
| total evalution | ⊚ | ⊚ | ⊚ | ⊚ | ○ | X | X |

TABLE 2

| | layer constitution | | |
|---|---|---|---|
| film-foming conditions | discharge injection inhibition layer | photo sensitive layer | surface layer |
| $SiH_4$ | 350 sccm | 350 sccm | 70 sccm |
| $H_2$ | 1000 sccm | 1000 sccm | 1000 sccm |
| $B_2H_6/SiH_4$ | 1000 sccm | 0 ppm | 0 ppm |
| NO | 10 sccm | 0 sccm | 0 sccm |
| $CH_4$ | 0 sccm | 0 sccm | 500 sccm |
| substarate temperature | 300° C. | 350° C. | 350° C. |
| inner pressure | 4.0 mTorr | 4.0 mTorr | 4.0 mTorr |
| microwave power | 800 W | 800 W | 800 W |
| bias voltage | 80 v | 80 v | 80 v |
| film thickness | 3 μm | 26 μm | 0.5 μm |

TABLE 3

| | experiment example 5 | experiment example 6 | comparative example 1 | comparative example 2 |
|---|---|---|---|---|
| evenness charge retentivity | ⊚ | ⊚ | △ | X |
| evenness in sensitivity | ○ | ⊚ | △ | X |
| minute line reproduction | ⊚ | ⊚ | ⊚ | ⊚ |
| fogging | ⊚ | ⊚ | ○ | ○ |
| uneven image | ⊚ | ⊚ | ○ | △ |
| defective image | ⊚ | ⊚ | ○ | △ |
| total evalution | ⊚ | ⊚ | △ | X |

BRIEF EXPLANATION OF THE DRAWINGS

FIG. 6 is a schematic longitudinal section view illustrating the constitution of a double pipe structure as the raw material gas feed means.

FIG. 7 is a schematic longitudinal section view illustrating the constitution of a triple pipe structure as the raw material gas feed means.

Figure 1:
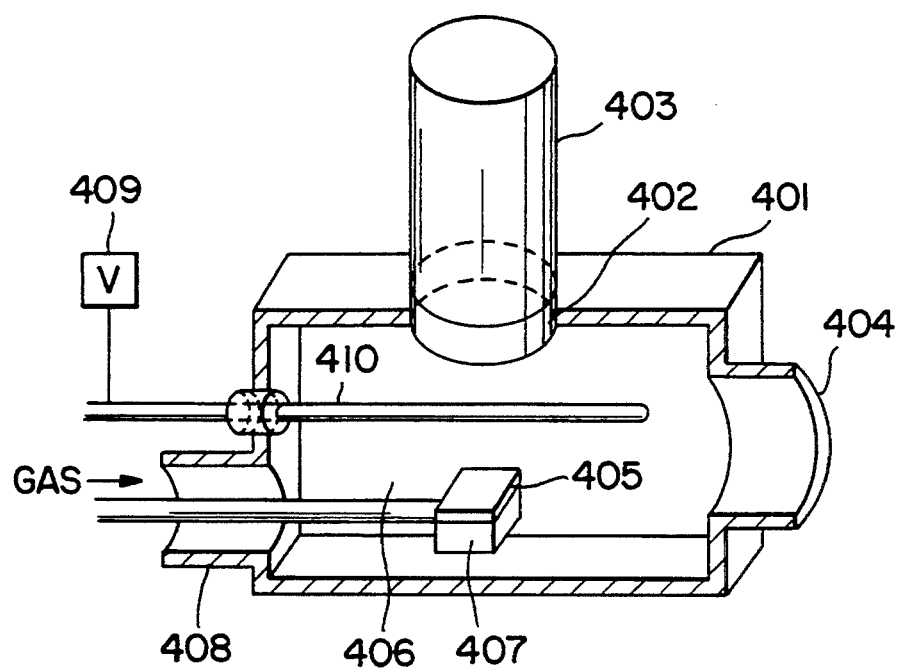
FIG. 1 is a schematic view for explaining the constitution of the conventional microwave plasma CVD apparatus.
Figure 2:
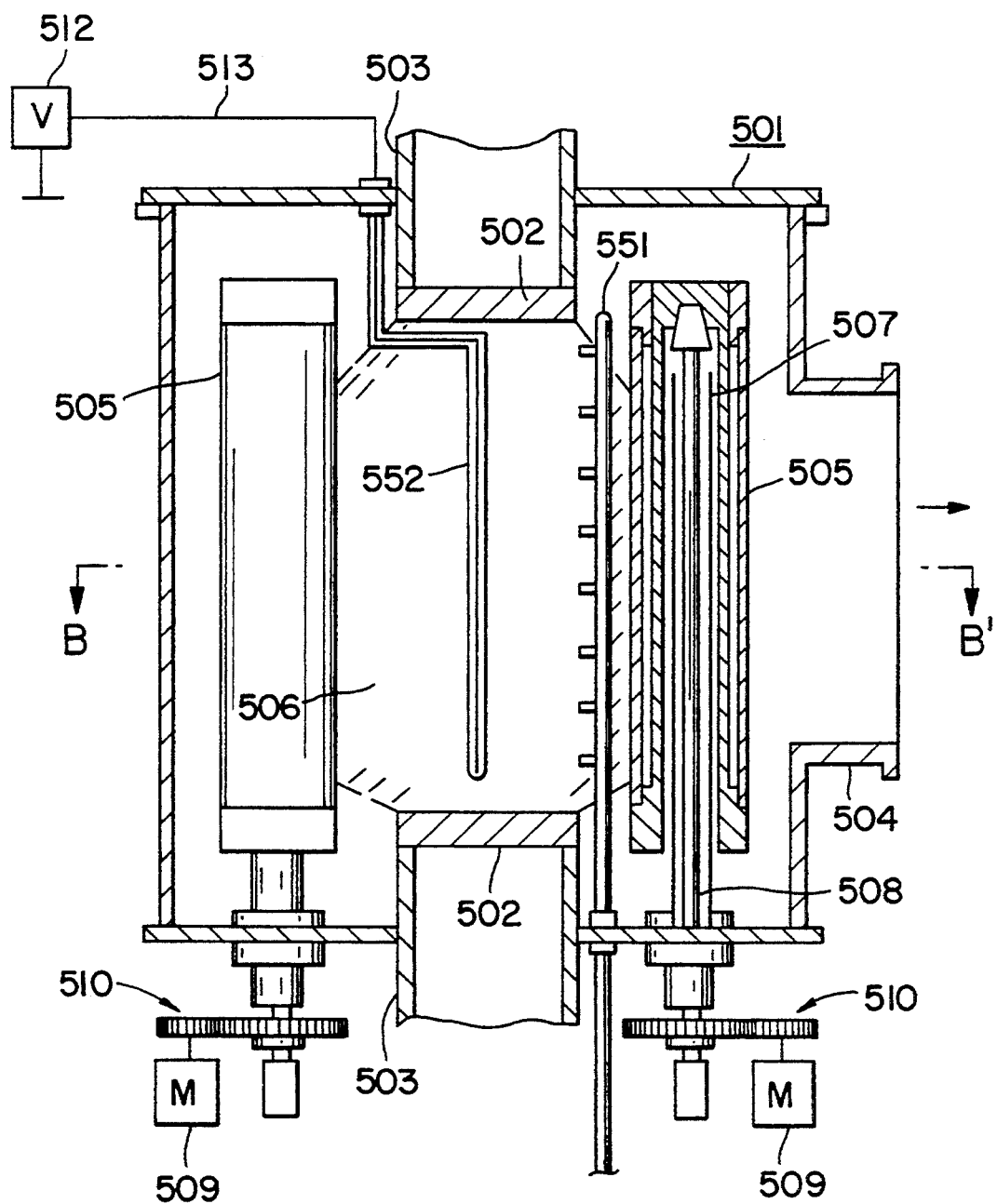
FIG. 2 is a schematic cross section view of the conventional microwave plasma CVD apparatus capable of forming a deposited film on each of a plurality of cylindrical substrate.
Figure 3:
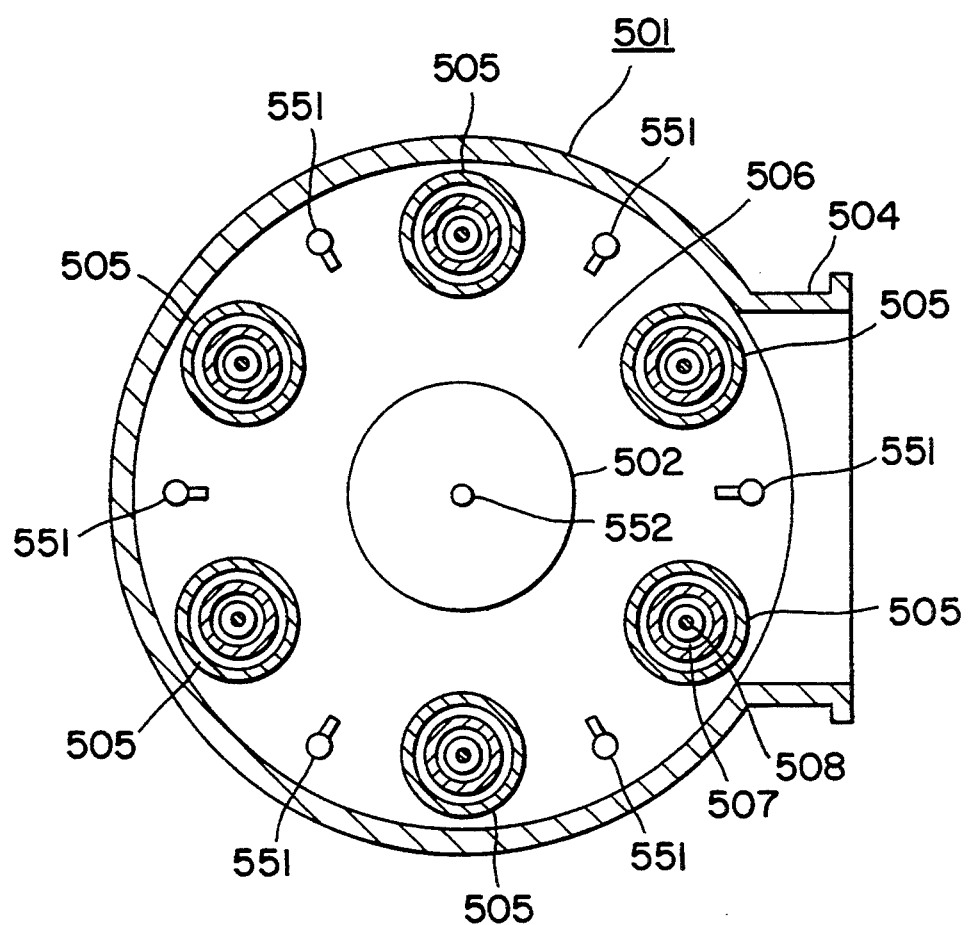
FIG. 3 is a schematic cross section view taken along line B-B' in the apparatus shown in FIG. 2.
Figure 4:
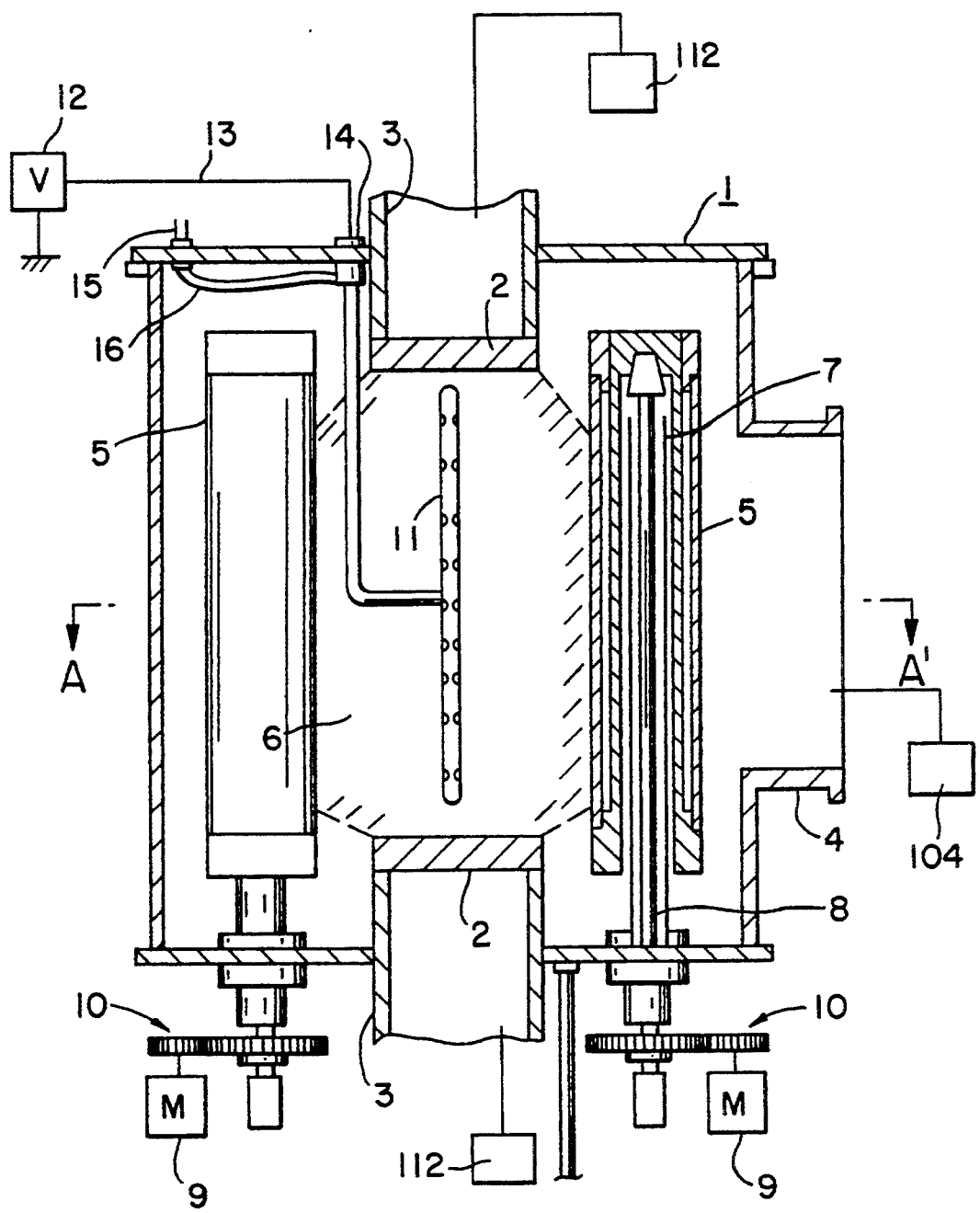
FIG. 4 is a schematic cross section view of an example of the microwave plasma CVD apparatus of the present invention.
Figure 5:
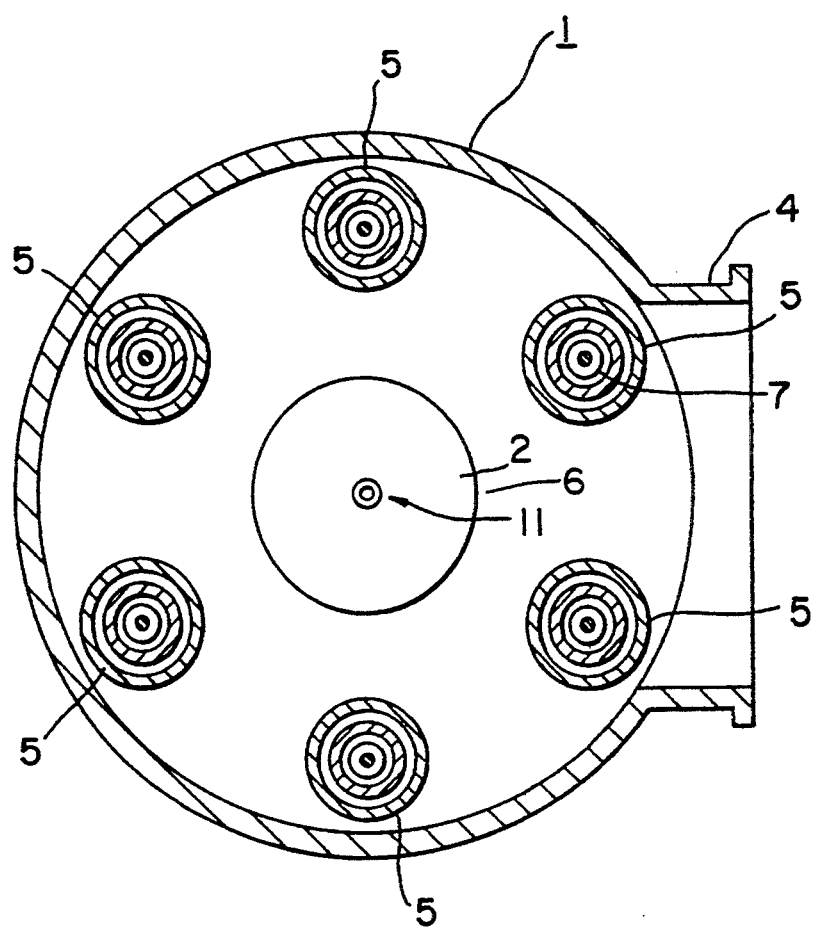
FIG. 5 is a schematic cross section view taken along line A-A' in the apparatus Shown in FIG. 4.
Figure 8:
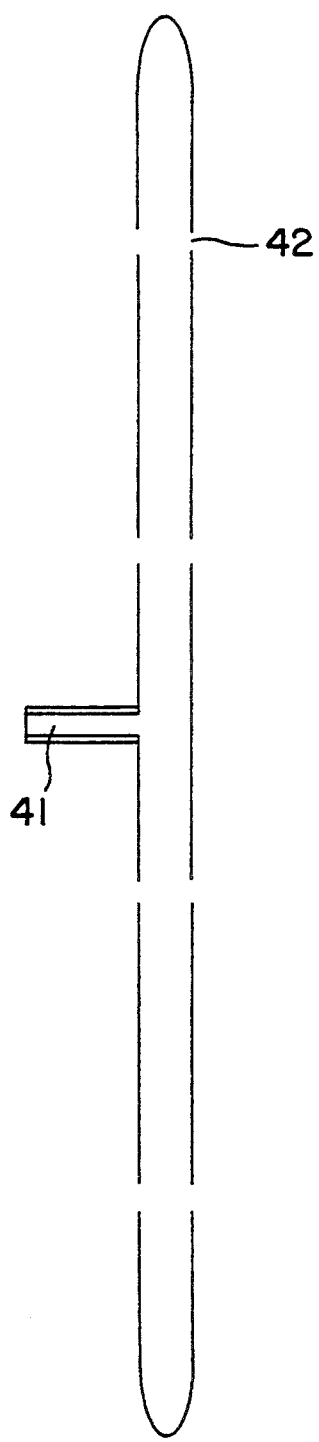
FIG. 8 is a schematic longitudinal section view illustrating the constitution of the conventional single pipe structure.
Figure 9:
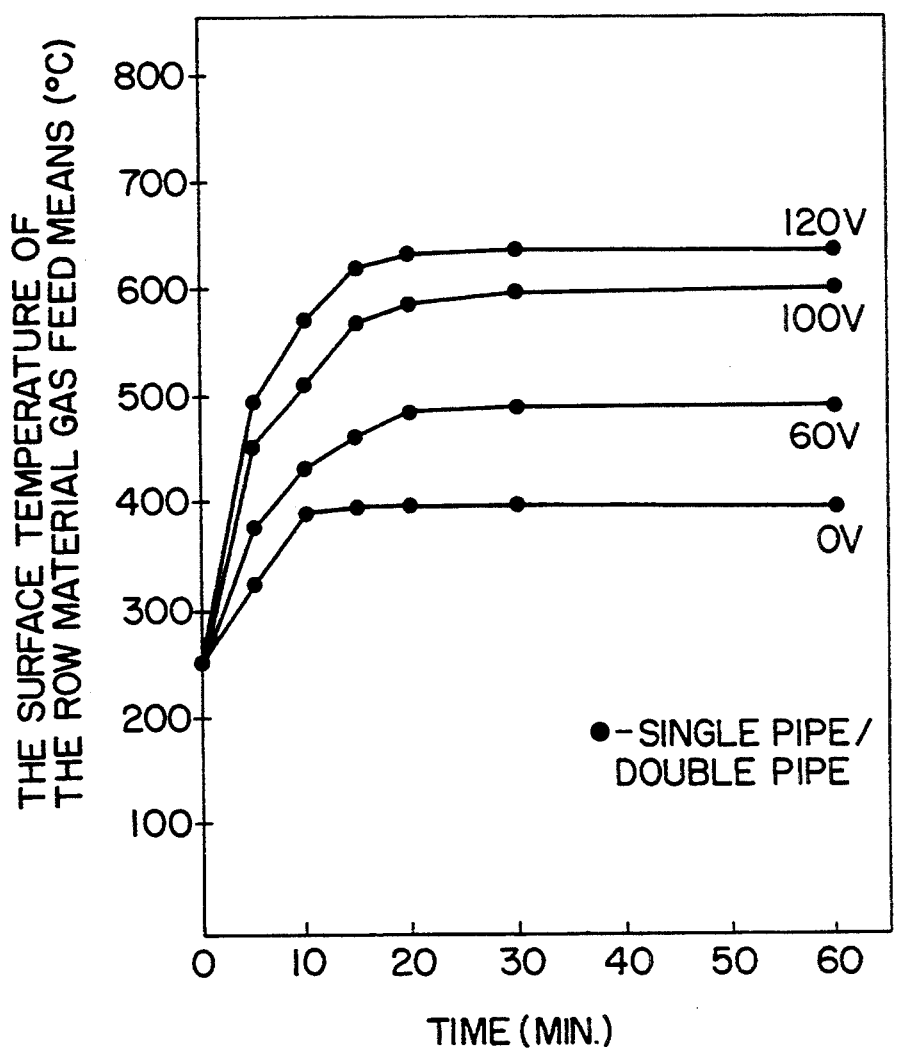
FIG. 9 is a graph illustrating changes in the surface temperature of the raw material gas feed means.
Figure 10:
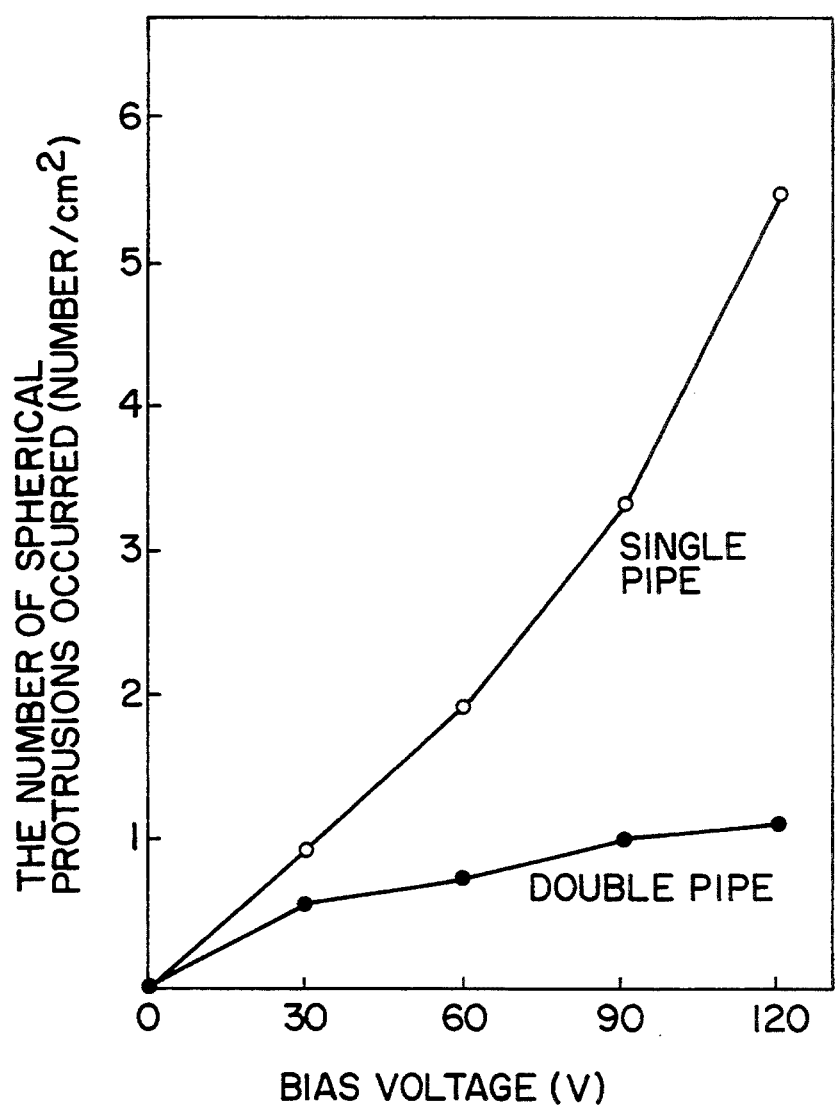
FIG. 10 is a graph illustrating the interrelation between he bias voltage and the number of spherical protrusions in a deposited film.
Figure 11:
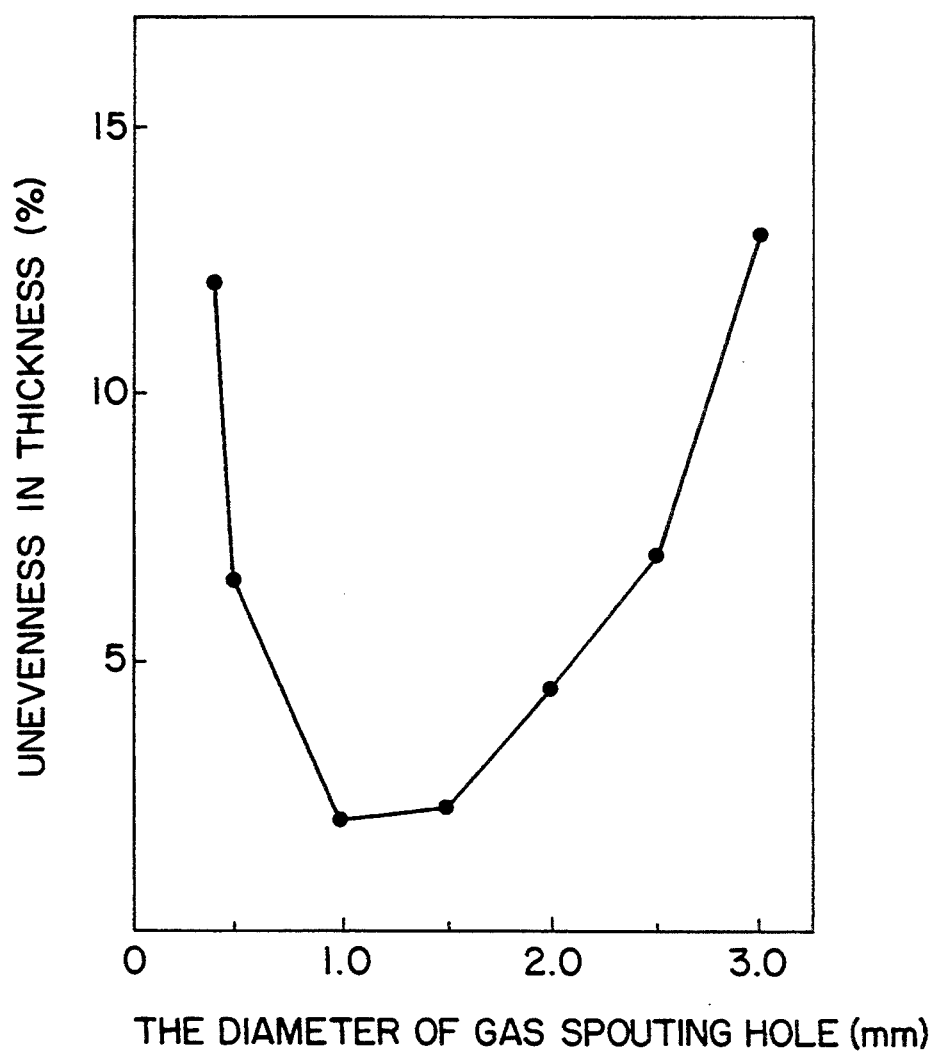
FIG. 11 is a graph illustrating the interrelation between the diameter of the gas spouting hole and the unevenness in film thickness.
Figure 12:
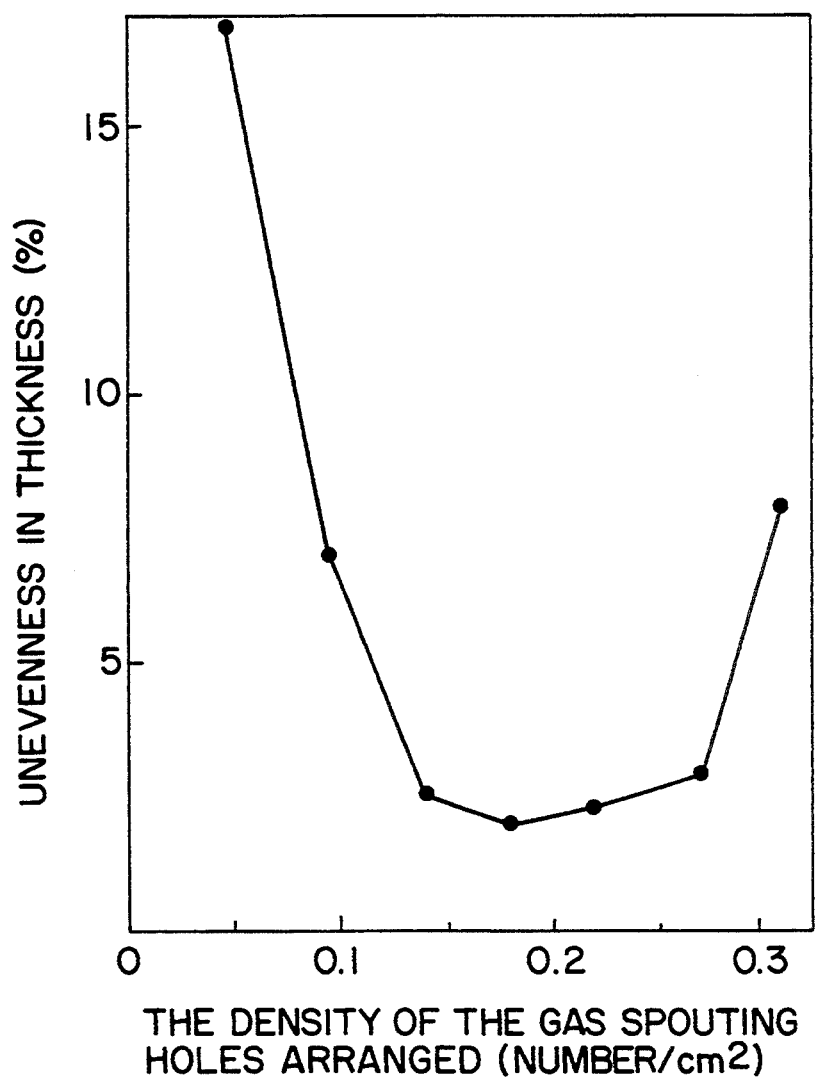
FIG. 12 is a graph illustrating the interrelation between the density of the gas spouting holes being arranged and the unevenness in film thickness.

We claim:

1. A deposited film-forming apparatus comprising a reaction chamber capable of maintaining at a reduced pressure, means for arranging a substrate on which a film is to be formed in said reaction chamber, a gas feed means for supplying a gaseous raw material into said reaction chamber and means for introducing a microwave energy into said reaction chamber, characterized in that said gas feed means is arranged in the space circumscribed by said substrate, said gas feed means comprises a coaxially aligned multiple pipe structure disposed such that the longitudinal exterior of said coaxially aligned multiple pipe structure is positioned along the surface of said substrate on which said film is to be formed, said coaxially aligned multiple pipe structure being provided with a connection at the central position thereof in the longitudinal direction such that said coaxially aligned multiple pipe structure is connected to a gas supply source through said connection so as to allow said gaseous raw material to supply into said coaxially aligned multiple pipe structure through said central position, the respective constituent pipes of said coaxially aligned multiple pipe structure being provided with a plurality of gas spouting holes such that said gas spouting holes are in communication with each other and wherein the gas spouting holes of adjacent coaxially aligned pipes of said coaxially aligned multiple pipe structure are not horizontally overlapped to provide a pressure drop in a space between said adjacent coaxially aligned pipes and means for supplying a bias voltage between said substrate and said gas feed means.

2. A deposited film-forming apparatus according to claim 1, wherein the number of the gas spouting holes disposed at each of the constituent pipes of the multiple pipe structure is increased from the inside toward the outside of the multiple pipe structure.

3. A deposited film-forming apparatus according to claim 1, wherein the substrate comprises a plurality of cylindrical substrates, said plurality of cylindrical substrates are arranged on a supporting means provided with means for rotating said plurality of cylindrical substrates.

4. A deposited film-forming apparatus according to claim 1, wherein the substrates are arranged such that an identical distance is established between each of the substrates and the gas feed means.

5. A deposited film-forming apparatus according to claim 1, wherein the gas feed means is disposed at the central portion of the discharge space.

6. A deposited film-forming apparatus according to claim 1, wherein the substrate is a belt-like shaped member which is arranged so as to circumscribe the space in which the gas feed means is disposed while being curved.

7. A deposited film-forming apparatus according to claim 1, wherein the diameter of the gas spouting hole disposed at an outer pipe of the gas feed means is 0.4 mm to 2.5 mm.

8. A deposited film-forming apparatus according to claim 1, wherein the number of the gas spouting holes disposed at an outer pipe of the gas feed means is 0.09 to 0.31 per square centimeter.

* * * * *

UNITED STATES PATENT AND TRADEMARK OFFICE
CERTIFICATE OF CORRECTION

PATENT NO. : 5,443,645

DATED : August 22, 1995

INVENTOR : HIROKAZU OTOSHI, ET AL.

It is certified that errors appear in the above-identified patent and that said Letters Patent is hereby corrected as shown below:

COLUMN 4

Line 50, "to be close" should read --close to the--;

Line 51, "matters" should read --matter--; and "fly" should read --flies--;

Line 60, "matters." should read --matter.--; and

Line 65, "Conventional" should read --conventional--.

COLUMN 5

Line 60, "under" should read --later--.

COLUMN 6

Line 64, "FIG. 7" should read --¶ FIG. 7--.

COLUMN 7

Line 23, "(SIN)," should read --(SiN),--; and "(SIC)," should read --(SiC),--.

COLUMN 8

Line 17, "portion" should read --portion is--;

Line 33, "by which" should read --of--; and

Line 38, "etc." should read --etc.,--.

UNITED STATES PATENT AND TRADEMARK OFFICE
CERTIFICATE OF CORRECTION

PATENT NO.  : 5,443,645

DATED       : August 22, 1995

INVENTOR    : HIROKAZU OTOSHI, ET AL.

It is certified that errors appear in the above-identified patent and that said Letters Patent is hereby corrected as shown below:

COLUMN 9

Line 9, "outer most" should read --outermost--.

COLUMN 10

Line 29, "a..porous" should read --a porous--;

Line 52, "alternate" should read --alternating--; and

Line 57, "alternate" should read --alternating--.

COLUMN 13

Line 17, "the,raw" should read --the raw--; and

Line 49, "a" (second occurrence) should be deleted.

COLUMN 14

Line 8, "what" should read --what is--; and

Line 38, "what" should read --what is--.

COLUMN 15

Line 50, "what" should read --what is--;

Line 56, "is occurred" should read --occurs--.

UNITED STATES PATENT AND TRADEMARK OFFICE
CERTIFICATE OF CORRECTION

PATENT NO. : 5,443,645

DATED : August 22, 1995

INVENTOR : HIROKAZU OTOSHI, ET AL.

It is certified that errors appear in the above-identified patent and that said Letters Patent is hereby corrected as shown below:

COLUMN 16

Line 1, "used" should read --use--;

Line 3, "what" should read --what is--; and

Line 48, "what" should read --what is--.

COLUMN 18

Line 12, "sever" should read --severe--;

Line 19, "an" should read --a--; and

Line 39, "an" should read --a--.

COLUMN 19

Line 22, "to thereby a" should read --to form a--; and

Line 33, "to thereby a" should read --to form a--.

COLUMN 20

Line 16, "sever" should read --severe--; and

Line 47, "substarate" should read --substrate--.

COLUMN 21

Lines 1-36, should be relocated to --Column 6, to follow 'SUMMARY OF THE INVENTION'--;

UNITED STATES PATENT AND TRADEMARK OFFICE
CERTIFICATE OF CORRECTION

PATENT NO. : 5,443,645

DATED : August 22, 1995

INVENTOR : HIROKAZU OTOSHI, ET AL.

It is certified that errors appear in the above-identified patent and that said Letters Patent is hereby corrected as shown below:

COLUMN 21,

Line 9, "substrate." should read --substrates.--;

Line 16, "Shown" should read --shown--; and

Line 29, "he" should read --the--.

COLUMN 22

Line 27, ".said" should read --said--.

Signed and Sealed this

Eighteenth Day of June, 1996

Attest:

BRUCE LEHMAN

Attesting Officer    Commissioner of Patents and Trademarks